United States Patent

Miyakawa

(10) Patent No.: US 10,416,573 B2
(45) Date of Patent: Sep. 17, 2019

(54) HOLDING APPARATUS, EXPOSURE APPARATUS AND MANUFACTURING METHOD OF DEVICE

(71) Applicant: NIKON CORPORATION, Tokyo (JP)

(72) Inventor: Tomoki Miyakawa, Kumagaya (JP)

(73) Assignee: NIKON CORPORATION, Tokyo (JP)

(*) Notice: Subject to any disclaimer, the term of this patent is extended or adjusted under 35 U.S.C. 154(b) by 0 days.

(21) Appl. No.: 15/671,533

(22) Filed: Aug. 8, 2017

(65) Prior Publication Data

US 2017/0357163 A1    Dec. 14, 2017

Related U.S. Application Data

(63) Continuation of application No. 13/985,832, filed as application No. PCT/JP2012/053803 on Feb. 17, 2012, now Pat. No. 9,746,787.

(30) Foreign Application Priority Data

Feb. 22, 2011 (JP) ................. 2011-035412

(51) Int. Cl.
*G03B 27/62* (2006.01)
*G03F 7/20* (2006.01)

(52) U.S. Cl.
CPC ...... *G03F 7/70783* (2013.01); *G03F 7/70716* (2013.01)

(58) Field of Classification Search
CPC ............ G03F 7/70691; G03F 7/70716; G03F 7/70725; G03F 7/70733; G03F 7/70758; G03F 7/70775; G03F 7/70783; G03F 7/70858; G03F 7/70908; G03F 7/70916–70933

USPC .... 355/30, 52, 53, 55, 72–77; 414/935, 676, 414/755; 430/5, 8, 22, 30, 311, 312, 394; 250/492.1, 492.2, 492.22, 493.1, 548

See application file for complete search history.

(56) References Cited

U.S. PATENT DOCUMENTS

| 4,370,054 A | 1/1983 | Isohata et al. |
| 4,780,617 A | 10/1988 | Umatate et al. |
| 5,424,552 A | 6/1995 | Tsuji et al. |
| 5,493,403 A | 2/1996 | Nishi |
| 5,534,970 A | 7/1996 | Nakashima et al. |

(Continued)

FOREIGN PATENT DOCUMENTS

| JP | 61-44429 | 3/1986 |
| JP | 64-54392 | 3/1989 |

(Continued)

OTHER PUBLICATIONS

Korean Office Action dated May 9, 2018 in corresponding Korean Patent Application No. 10-2013-7024479.

(Continued)

*Primary Examiner* — Christina A Riddle

(57) ABSTRACT

A holding apparatus includes a holding portion that includes a first member which contacts a portion of an object, a second member which at least a portion thereof is fixed to a base, and a connection member which is configured to connect the first and second members, and a driving unit which drives the holding portion to change at least a posture of the first member, wherein a relative positional relationship between the first member and the second member is changed via the connection member.

19 Claims, 8 Drawing Sheets

(56) References Cited

U.S. PATENT DOCUMENTS

| | | | |
|---|---|---|---|
| 5,854,819 | A | 12/1998 | Ham et al. |
| 6,195,154 | B1 | 2/2001 | Imai |
| 6,208,407 | B1 | 3/2001 | Loopstra |
| 6,262,796 | B1 | 7/2001 | Loopstra et al. |
| 6,341,007 | B1 | 1/2002 | Nishi et al. |
| 6,400,441 | B1 | 6/2002 | Nishi et al. |
| 6,549,269 | B1 | 4/2003 | Nishi et al. |
| 6,590,634 | B1 | 7/2003 | Nishi et al. |
| 6,611,316 | B2 | 8/2003 | Sewell |
| 6,778,257 | B2 | 8/2004 | Bleeker et al. |
| 7,023,610 | B2 | 4/2006 | Ohtsuki et al. |
| 7,489,389 | B2 | 2/2009 | Shibazaki |
| 7,667,829 | B2 | 2/2010 | Kaise et al. |
| 8,358,401 | B2 | 1/2013 | Shibazaki et al. |
| 9,746,787 | B2 | 8/2017 | Miyakawa |
| 2002/0149758 | A1 | 10/2002 | Poon |
| 2003/0016338 | A1 | 1/2003 | Yasuda et al. |
| 2003/0169409 | A1* | 9/2003 | Nishi .................. G03F 7/70716 355/51 |
| 2007/0291261 | A1 | 12/2007 | Kobayashi |
| 2010/0073661 | A1 | 3/2010 | Shibazaki et al. |
| 2011/0086315 | A1* | 4/2011 | Ichinose ............. G03F 7/70716 430/325 |
| 2014/0049763 | A1 | 2/2014 | Miyakawa |

FOREIGN PATENT DOCUMENTS

| | | |
|---|---|---|
| JP | 2-40594 | 2/1990 |
| JP | 3-88317 | 4/1991 |
| JP | 4-65603 | 3/1992 |
| JP | 5-41344 | 2/1993 |
| JP | 8-37149 | 2/1996 |
| JP | 9-211872 | 8/1997 |
| JP | 2001-023886 | 1/2001 |
| JP | 2003-133223 | 5/2003 |
| JP | 2007-184328 | 7/2007 |
| JP | 2007184328 A * | 7/2007 |
| JP | 6380498 | 8/2018 |
| KR | 10-2010-0128352 | 12/2010 |
| WO | WO 98/28665 | 7/1998 |
| WO | WO 99/49504 | 9/1999 |
| WO | WO 01/35168 | 5/2001 |
| WO | WO 2006/016584 | 2/2006 |
| WO | WO 2007/119821 | 10/2007 |

OTHER PUBLICATIONS

Office Action issued by the Japanese Patent Office dated Jul. 5, 2016 in corresponding Japanese patent application No. 2013-501003.

Japanese Office Action dated Nov. 17, 2015 in corresponding Japanese Patent Application No. 2013-501003.

PCT International Search Report and Written Opinion of the International Searching Authority dated Apr. 3, 2012 in corresponding International Patent Application No. PCT/JP2012/053803.

Office Action dated Oct. 21, 2015 in U.S. Appl. No. 13/985,832.

Notice of Allowance dated Jun. 22, 2016 in U.S. Appl. No. 13/985,832.

Corrected Notice of Allowance dated Sep. 26, 2016 in U.S. Appl. No. 13/985,832.

Notice of Allowance dated Apr. 5, 2017 in U.S. Appl. No. 13/985,832.

U.S. Appl. No. 13/985,832, filed Oct. 28, 2013, Tomoki Miyakawa, Nikon Corporation.

Japanese Office Action dated Mar. 12, 2019 in Japanese Patent Application No. 2018-098468.

* cited by examiner

HOLDING APPARATUS, EXPOSURE APPARATUS AND MANUFACTURING METHOD OF DEVICE

The present invention relates to a holding apparatus which can hold an object, an exposure apparatus, an exposure method, and a manufacturing method of a device.

This application is a continuation of U.S. application Ser. No. 13/985,832 filed Oct. 28, 2013, which is a U.S. National Stage application of International Patent Application No. PCT/JP2012/053803 filed Feb. 17, 2012, which claims foreign priority benefit of Japanese Patent Application No. 2011-035412, filed on Feb. 22, 2011, the contents of both of which are incorporated herein by reference.

TECHNICAL FIELD

Background Art

In a so-called a lithography process which transfers a pattern formed on a mask or a reticle (hereinafter, collectively referred to as the "mask") to a photosensitive substrate, an exposure apparatus is used which projects the pattern of the mask held to a mask stage to each shot on the photosensitive substrate via a projection optical system.

In recent years, in the exposure apparatus, higher resolution of the projection optical system is required to correspond to higher integration of the pattern. The resolution of the projection optical system is increased as the used exposure wavelength is shortened and a numerical aperture of the projection optical system is increased. Accordingly, the exposure wavelength used in the exposure apparatus is shortened year by year, and the numerical aperture of the projection optical system is also increased. Currently, a mainstream exposure wavelength is 248 nm of KrF excimer laser and 193 nm of ArF excimer laser. Moreover, when exposure is performed, similar to the resolution, a depth of focus (DOF) is also important. The resolution R and the depth of focus δ are represented by the following Expressions (1) and (2).

$$R = k1 \cdot \lambda / NA \quad (1)$$

$$\delta = \pm k2 \cdot \lambda / NA2 \quad (2)$$

Here, λ is the exposure wavelength, NA is the numerical aperture of a projection exposure system, and k1 and k2 are process coefficients.

According to Expressions (1) and (2), in order to increase the resolution R, it is understood that the depth of focus δ is decreased if the exposure wavelength λ is decreased and the numerical aperture NA is increased.

If the depth of focus δ is narrowed too much, it is difficult to make a substrate surface coincide with an image surface of the projection optical system, and there is a concern that a focus margin may be insufficient when the exposure operation is performed. Accordingly, as a method which substantially shortens the exposure wavelength and widens the depth of focus, for example, a liquid immersion method disclosed in Patent Document 1 below is suggested. In the liquid immersion method, liquid such as pure water or organic solvent is filled between a mask of a projection optical system and a substrate surface, resolution is improved using a wavelength of exposure light in the liquid becoming 1/n (n is a refractive index in air and approximately 1.2 to 1.6 in general) in air, the depth of focus is enlarged to be approximately n times, and a liquid immersion exposure apparatus which exposes a substrate in high resolution by the liquid immersion method is used.

PRIOR ART DOCUMENT

Patent Document

[Patent Document 1]
PCT International Publication No. WO 99/49504

SUMMARY OF INVENTION

Problems to be Solved by the Invention

However, in the exposure which uses a light source having high energy such as KrF excimer laser or ArF excimer laser, if the exposure is performed on the substrate via the projection optical system by the light source, aberration change is generated in a lens (in general, refractive optical element) which configures the projection optical system. A pattern image surface of the mask is changed by the aberration change, and thus, exposure precision of the substrate may be deteriorated.

An aspect of the present invention provides a holding apparatus, an exposure apparatus, and a manufacturing method of a device for precisely exposing a pattern formed on the mask on the substrate.

Means for Solving the Problem

According to a first aspect of the present invention, a holding apparatus is provided, including: a holding portion that comprises a first member which contacts a portion of an object, a second member which at least a portion thereof is fixed to a base, and a connection member which is configured to connect the first and second members; and a driving unit which is configured to drive the holding portion to change at least a posture of the first member which holds the object, wherein a relative positional relationship between the first member and the second member is changed via the connection member.

According to a second aspect of the present invention, an exposure apparatus is provided including the holding apparatus according to the first aspect of the present invention, wherein holding apparatus is capable of holding a mask on which a pattern is formed as the object, and the pattern is transferred to a substrate.

According to a third aspect of the present invention, a holding apparatus is provided, including: a holding portion that comprises a first member which contacts a portion of the mask, a second member to which at least a portion of an apparatus main body is fixed, and a connection member which is configured to connect the first and second members; and a driving unit which is configured to drive the holding portion to change an inclination of the first member, wherein holding portion comprises a first holding portion which is configured to hold one end portion of the mask and a second holding portion which is configured to hold another end portion of the mask, and the first and second holding portions comprise the first member, the second member, and the connection member respectively, the driving unit is configured to bend the mask by changing an inclination of the first member of the first holding portion and an inclination of the first member of the second holding portion in directions different from each other, and the connection member is configured to change a position of the first member with respect to the second member according to a change of the inclination of the first member.

According to a fourth aspect of the present invention, an exposure apparatus is provided including the holding apparatus according to the third aspect of the present invention, wherein the pattern is transferred to a substrate.

According to a fifth aspect of the present invention, an exposure method is provided, including, the exposure apparatus according to the second aspect of the present invention and the fourth aspect of the present invention, deforming the mask; and transferring the pattern of the mask to the substrate.

According to a sixth aspect of the present invention, a holding apparatus is provided, including: a holding portion configured to hold the optical member; a driving unit which is configured to deform the optical member by driving the holding portion and affecting a bending moment around a first axis to the held optical member; and a support portion which is configured to support the holding portion in a freely displaceable manner along the second axis according to the bending moment.

According to a seventh aspect of the present invention, an exposure apparatus is provided, including: the holding apparatus according to the sixth aspect of the present invention, wherein the holding apparatus is capable of holding a mask on which a pattern is formed as an optical member, and the pattern is transferred to a substrate.

According to an eighth aspect of the present invention, an exposure method is provided, including, using the exposure apparatus according to the seventh aspect, deforming the mask; and transferring a pattern of the mask to the substrate.

According to a ninth aspect of the present invention, a manufacturing method of a device is provided, including: exposing the substrate using the exposure apparatus according to the second aspect of the present invention, the exposure apparatus according to the fourth aspect of the present invention, or the exposure apparatus according to the seventh aspect of the present invention; and developing the exposed substrate.

According to a tenth aspect of the present invention, a holding apparatus is provided, including: a first member which contacts a portion of the object; a second member; a connection member which is configured to connect the first member and the second member; and a driving unit which is configured to drive at least one of the first member, the second member, and the connection member to change a posture of the first member with respect to the second member.

DESCRIPTION OF EMBODIMENTS

Hereinafter, embodiments of the present invention will be described with reference to the drawings. However, the present invention is not limited thereto.

Moreover, in descriptions below, an XYZ rectangular coordinate system is set, and it is described with reference to the XYZ rectangular coordinate system. A predetermined direction in a horizontal surface is set to an X axis direction, a direction orthogonal to the X axis direction in the horizontal surface is set to a Y axis direction, and a direction (that is, a vertical direction) orthogonal to each of the X axis direction and the Y axis direction is set to a Z axis direction. Moreover, rotation (inclination) directions around the X axis, the Y axis, and the Z axis are set to θX, θY, and θZ directions respectively.

First Embodiment

A first embodiment of the present invention will be described.

First, a configuration of an exposure apparatus EX of the present embodiment will be described with reference to FIG. 1.

Figure 1:
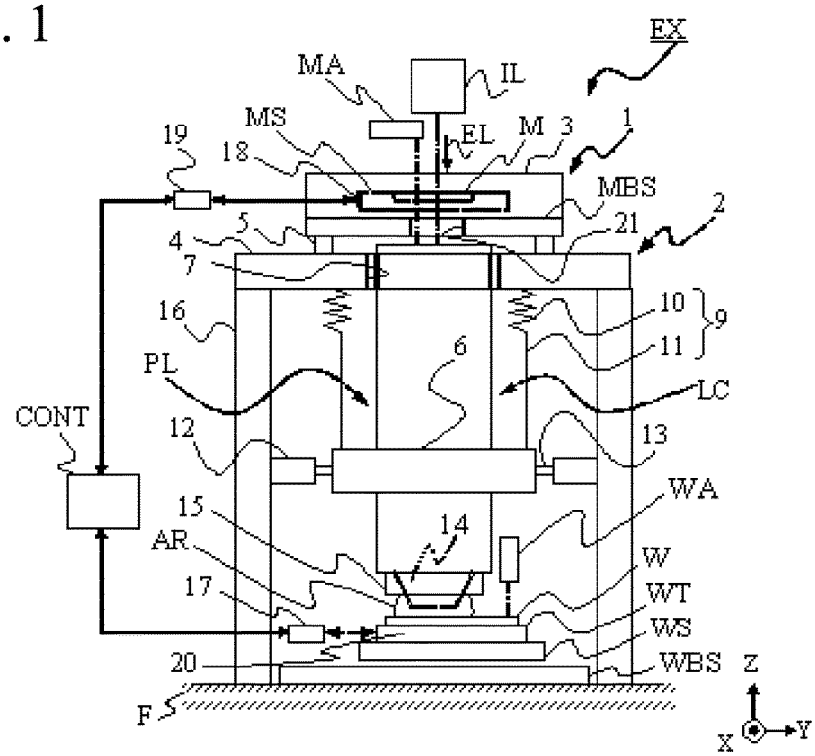
FIG. 1 is a schematic configuration view showing an example of an exposure apparatus according to a first embodiment.

FIG. 1 is a schematic configuration view showing an example of the exposure apparatus EX in the present embodiment.

The exposure apparatus EX of the present embodiment includes: an illumination unit IL; a mask stage apparatus 1 (holding apparatus, base material) which drives a mask M (object, plate-like object, optical member, plate-like optical member) in the Y axis direction, which is a scanning direction, by a predetermined stroke and minutely drives the mask in the X axis direction, the Y axis direction, and the θZ direction; a mask alignment system MA which is provided near the mask stage apparatus 1; a projection optical system PL; a substrate alignment system WA which is provided near the projection optical system PL; a substrate stage WS which drives a substrate table WT, which can hold a substrate W, in an XY two-dimensional direction; a liquid immersion apparatus 15 in which a supply port supplying liquid on the substrate W (substrate table WT) and a recovery port recovering the supplied liquid are provided; a column 2 which holds the mask stage apparatus 1 and the projection optical system PL; and a controller CONT which controls each element of the exposure apparatus EX and the entire operation.

Hereinafter, each element of the configuration of the exposure apparatus EX will be described.

The illumination unit IL includes a light source which emits illumination light EL and an illumination optical system. The illumination unit radiates the illumination light EL to a rectangular or arc illumination region which is defined by a field stop (also referred to as a masking blade or a reticle blind) disposed in the inner portion of the illumination unit, and illuminates the mask M, on which a circuit pattern is formed, with uniform illuminance. For example, an illumination system similar to the illumination unit IL is disclosed in U.S. Pat. No. 5,534,970 or the like. Here, as an example, ArF excimer laser light (wavelength 193 nm) is used for the illumination light EL.

The column 2 is configured of a plurality of legs 16 in which the lower end portions of the legs are fixed to a floor surface F, and a top plate portion 4 which is supported by the legs 16 at the above of the floor surface F. An opening 7 which passes through in an up-down direction (Z axis direction) is formed in a center portion of the top plate portion 4. The column 2 holds the mask stage apparatus 1 and the projection optical system PL. In the present embodiment, the number of the legs 16 is three.

The mask stage apparatus 1 includes a surface plate MBS disposed below (−Z direction) the illumination unit IL, a mask stage MS disposed on the surface plate MBS, a counter mass 3 configured of a frame-like member disposed on the surface plate MBS to surround the mask stage MS, a mask stage-driving apparatus (not shown) which drives the mask stage MS, or the like.

The surface plate MBS is approximately horizontally supported on the top plate portion 4 of the column 2 via a plurality of vibration isolation units 5, and an opening 21, which communicates with the opening 7 of the top plate portion 4 in the Z direction, is formed in the center portion of the surface plate. In the present embodiment, three vibration isolation units 5 are installed. The mask stage MS is disposed on the surface plate MBS, and the mask M is held on the mask stage MS. In addition, a reflection surface 18 is provided at the mask stage MS, and a mask side laser interferometer 19 is provided at a position corresponding to the reflection surface 18. The mask side laser interferometer 19 radiates a measurement laser to the reflection surface 18 of the mask stage MS, detects a measurement laser which is reflected via the reflection surface 18, and thus, measures positional information with respect to the maskstage MS. In the present embodiment, the mask side laser interferometer 19 measures a position in an XY plane and a rotation angle in the θZ direction of the mask stage MS in real time. The controller CONT drives the maskstage-driving apparatus (not shown) based on measured results of the mask side laser interferometer 19, and performs a position control of the mask M which is held on the mask stage MS. A specific configuration or the like of the mask stage apparatus 1 will be described in detail below.

The mask alignment system MA, which detects a mask alignment mark (not shown) formed on the mask M and a mask reference mark (not shown) formed on the substrate table WT, is provided near the mask stage apparatus 1. In the present embodiment, the mask alignment system MA measures a position deviation amount of the mask alignment mark with respect to the mask reference mark in a coordinate system which is defined by the mask side laser interferometer 19, and performs alignment between the mask M and the mask reference mark.

In the projection optical system PL, a catadioptric optical system which is configured of a plurality of lenses (lens element) having a common optical axis in the Z axis direction, a terminal optical element 14 nearest to the image surface of the projection optical system PL, and a reflection optical element is used, and the projection optical system is a both-side telecentric system and has a predetermined projection magnification (¼). Accordingly, a portion (illumination region) of the mask M is illuminated by the illumination light EL from the illumination unit IL, the image becomes a reduced image via the projection optical system PL, is coated by a resist (photosensitive material), and is projected to an exposure region (shot) of the substrate W which is disposed at the image surface side of the projection optical system PL.

The terminal optical element 14 is formed of fluorite. Since the fluorite has high affinity with water, the fluorite can make liquid come into close contact with approximately the entire surface of a liquid contact surface of the terminal optical element 14.

Moreover, the projection optical system PL may be a dioptric system configured of only a plurality of lenses or a catoptrics system configured of only the reflection optical element. In addition, the projection magnification of the projection optical system PL need not be ¼, but may be ⅕ or ⅛. In addition, the projection optical system need not be a reduction system, but may be an equal magnification system or an enlargement system. Moreover, the projection optical system PL may form either an inverted image or an erect image.

In addition, the terminal optical element 14 may be quartz having high affinity with water, and the affinity with fluid may be increased by performing hydrophilic treatment (lyophilic treatment) on the liquid contact surface of the terminal optical element 14.

Moreover, in the projection optical system PL, a lens controller LC is provided which configure a lens configuring the projection optical system PL to move with respect to the optical axis, and which adjusts a refractive index or temperature of gas in the projection optical system PL and corrects an aberration. As an example in which the lens is configured to move with respect to the optical axis, as disclosed in Japanese Unexamined Patent Application, First Publication No. H05-41344 (Corresponding to U.S. Pat. No. 5,424,552), there is an aberration correction method which moves the lens in an optical axis direction, moves (shifts) the lens in a direction orthogonal to the optical axis, or inclines (tilts) the lens with respect to the optical axis.

A flange 6 is provided at approximately the center in the Z axis direction of a lens barrel of the projection optical system PL. The projection optical system PL is supported to be hung to the flange 6 portion via a plurality of hanging mechanisms 9 in which one end is fixed to the lower surface side of the top plate portion 4. Each of the hanging mechanisms 9 includes a coil spring 10 or a wire 11 which is a connection member having a flexible structure. In the present embodiment, the number of the hanging mechanisms 9 is three.

Moreover, protruding portions 12 are formed near the center portion with respect to the Z axis direction of each leg 16 of the column 2, and a drive system 13 is provided between each protruding portion 12 and an outer circumferential portion of the flange 6 of the projection optical system PL. The drive system 13 is configured of a voice coil motor which drives the lens barrel of the projection optical system PL in a radial direction and a voice coil motor which drives the projection optical system PL in the optical axis direction. That is, the projection optical system PL is configured to be movable in directions of six degrees of freedom by the drive system 13.

An acceleration sensor (not shown), which detects acceleration in directions of six degrees of freedom of the projection optical system PL, is provided at the flange 6. The controller CONT controls the drive of the voice coil motor of the drive system 13 based on the acceleration information detected by the acceleration sensor so that the projection optical system PL becomes stationary with respect to the column 2 and the floor surface F.

The liquid immersion apparatus 15 is disposed to surround the terminal optical element 14. The supply port which supplies the liquid and the recovery port which recovers the liquid supplied from the supply port are provided. Aliquid supply apparatus (not shown) is connected to the supply port, and a liquid recovery apparatus (not shown) is connected to the recovery port. The liquid supply apparatus includes a tank which accommodates the liquid, a pressure pump, or the like, and supplies the liquid to the substrate table WT via the supply port. The liquid recovery apparatus includes a vacuum system (suction apparatus) such as a vacuum pump, a tank which accommodates the recovered liquid, or the like, and recovers the liquid on the substrate table WT via the recovery port. Aliquid immersion region AR is formed between a lower surface of the liquid immersion apparatus 15 and a lower surface of the terminal optical element 14, and the substrate W (substrate table WT) by adjusting a supply amount of the liquid supplied to the substrate table WT and a recovery amount of the recovered liquid. In the present embodiment, the liquid which forms the liquid immersion region AR is water.

Moreover, the exposure apparatus EX does not necessarily need the tank or the pressure pump which supplies the liquid and the vacuum system or the tank which recovers the liquid, and facilities in factories in which the exposure apparatus EX is installed or the like may be used.

The substrate alignment system WA is provided near the tip of the projection optical system PL.

The substrate alignment system WA adopts a Field Image Alignment (FIA) method as disclosed in Japanese Unexamined PatentApplication, First Publication No. H04-65603 (corresponding to U.S. Pat. No. 5,493,403), which illuminates a substrate alignment mark (not shown) formed on the exposure region (shot) of the substrate W or a reference mark for a substrate (not shown) formed on the substrate table WT by illumination light such as white light from a halogen lamp, and measures the positions of the marks by imaging those mark images with a CCD camera.

The substrate stage WS is supported to be floated via an air bearing or the like on the upper surface of the surface plate WBS disposed below the projection optical system PL. The substrate stage WS can be freely driven in the XY plane along the upper surface of the surface plate WBS via a substrate stage drive system (not shown) by the control of the controller CONT while holding the substrate W via the substrate table WT.

The surface plate WBS is provided on the floor surface F. A +Z side surface (upper surface) of the surface plate WBS is processed with very high flatness, and becomes a movement reference surface (guide surface) of the substrate stage WS.

A substrate-holding portion (not shown) is provided at the substrate table WT, and the substrate W is held by vacuum adsorption or the like at the substrate-holding portion. Moreover, the mask reference mark (not shown) detected by the mask alignment system MA and the substrate reference mark detected by the substrate alignment system WA are provided at the substrate table WT. Moreover, a reflection surface 20 is provided at the substrate table WT, and a substrate side laser interferometer 17 is provided at a position corresponding to the reflection surface 20.

The substrate side laser interferometer 17 radiates a measurement laser to the reflection surface 20 of the substrate table WT, detects the measurement laser reflected via the reflection surface 20, and thus, measures the positional information related to the substrate table WT (substrate W). In the present embodiment, the substrate side laser interferometer 17 measures a position in an XY plane and a rotation angle in the θZ direction of the substrate table WT in real time. The controller CONT drives a substrate stage-driving apparatus (not shown) based on measured results of the substrate side laser interferometer 17, and performs a position control of the substrate W which is held on the substrate table WT.

A focus detection system (not shown) is provided near the upper portion of the substrate table WT. The focus detection system includes a light-emitting portion and a light-receiving portion, projects detection light on the surface (exposure surface) of the substrate W in an inclined direction from the light-emitting portion, and receives the reflected light by the light-receiving portion. n For example, as the configuration of the focus detection system, a configuration which is disclosed in Japanese Unexamined Patent Application, First Publication No. H08-37149 (corresponding to U.S. Pat. No. 6,195,154) may be used. The focus detection system detects a position (focus position) in the Z axis direction of the substrate W in a state where the liquid is not present (the liquid immersion region AR is not formed) on the substrate W (the upper surface of the substrate table). Moreover, the θX and θY of the substrate W are detected by detecting several positions (focus positions) in the Z direction of the substrate W. That is, the deviation between the image surface of the pattern image of the mask M formed via the projection optical system PL and the liquid, and the upper surface of the substrate W is detected. Moreover, the focus detection system may project the detection light on the surface of the substrate W via the liquid.

Next, the specific configuration of the mask stage apparatus 1 will be described with reference to FIG. 2.

Figure 2:
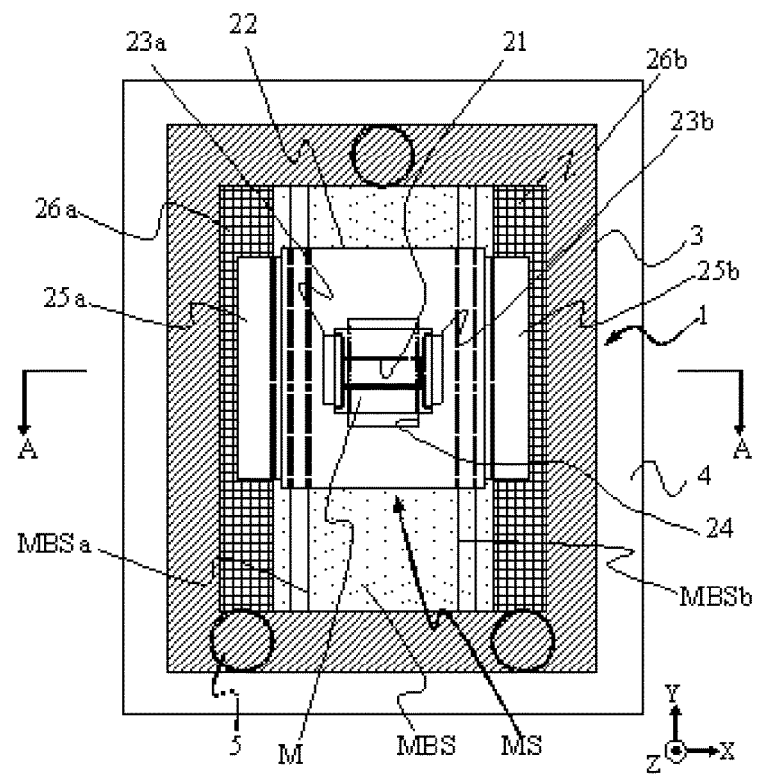
FIG. 2 is a plan view showing a mask stage apparatus according to the first embodiment and the vicinity thereof.

FIG. 2 is a plan view showing the mask stage apparatus 1 according to the present embodiment and the vicinity thereof.

As shown in FIG. 2, when the surface plate MBS is viewed from above, the surface plate is configured of a plate-like member having an approximately rectangular shape in which an outer frame of the counter mass 3 becomes four sides of the surface plate, and the opening 21 which becomes the passage of the illumination light EL is formed in the center portion of the surface plate. The opening 21 communicates with the above-described opening 7 (refer to FIG. 1) of the top plate portion 4 in the Z direction. Protruding portions MBSa and MBSb extend in the Y axis direction at positions which are separated at an equal distance in the –X direction and the +X direction from the center of the upper surface of the surface plate MBS. The upper surfaces (+Z side surfaces) of the protruding portions MBSa and MBSb are processed with very high flatness, and become guide surfaces when the mask stage MS moves.

Three vibration isolation units 5 provided between the surface plate MBS and the top plate portion 4 include air dampers respectively. Avibration having relatively high frequency is prevented from being transmitted to the mask stage MS by the vibration isolation units 5. Moreover, the air damper included in each of the vibration isolation units 5 may be a mechanical damper such as a hydraulic type.

Furthermore, an X voice coil motor (not shown) which operates the driving force in the X axis direction to the mask stage surface plate MBS, a Y voice coil motor (not shown) which operates the driving force in the Y axis direction, and a Z voice coil motor (not shown) which operates the driving force in the Z axis direction are provided between the surface plate MBS and the top plate portion 4.

In the present embodiment, the X voice coil motor and the Y voice coil motor each are provided one by one between the mask stage surface plate MBS and the top plate portion 4, and can move the mask stage surface plate MBS in the X axis direction, the Y axis direction, and the θZ direction. Moreover, three Z voice coil motors are provided at three places which are not arranged on a straight line between the mask stage surface plate MBS and the top plate portion 4, and can move the mask stage surface plate MBS in the Z axis direction, the θX direction, and the θY direction. Accordingly, the mask stage surface plate MBS can be driven in the direction of six degrees of freedom (X axis direction, Y axis direction, Z axis direction, θX direction, θY direction, and θZ direction) with respect to the top plate portion 4.

Moreover, the X voice coil motor and the Y voice coil motor need not be provided one by one, and at least one of two voice coil motors may be provided as two.

In addition, three Z voice coil motors need not be provided, and three or more motors may be provided as long as three motors are provided at three places which are not arranged on a straight line between the mask stage surface plate MBS and the top plate portion 4.

Moreover, the position of the surface plate MBS is measured by a surface plate interferometer (not shown) or a Z encoder (not shown) based on the projection optical system PL.

The mask stage MS is configured of a stage main body 22 (base), a mask-holding portion 23 (holding portion) which holds the mask M and in which a portion is fixed to the stage main body 22, and movable elements 25a and 25b which are fixed to the stage main body 22 and drives the mask stage MS. Each of the movable elements 25a and 25b engage with stators 26a and 26b supported by the counter mass 3 to configure a linear motor.

An opening 24 through which the illumination light EL passes via the mask M is formed at the stage main body 22. That is, the illumination light EL illuminating the mask M enters the projection optical system PL via the opening 24, the opening 21 of the surface plate MBS, and the opening 7 of the top plate portion 4.

Hereinafter, the details of the mask stage MS of the present embodiment will be described with reference to FIGS. 3, 4 and 5.

Figure 3:
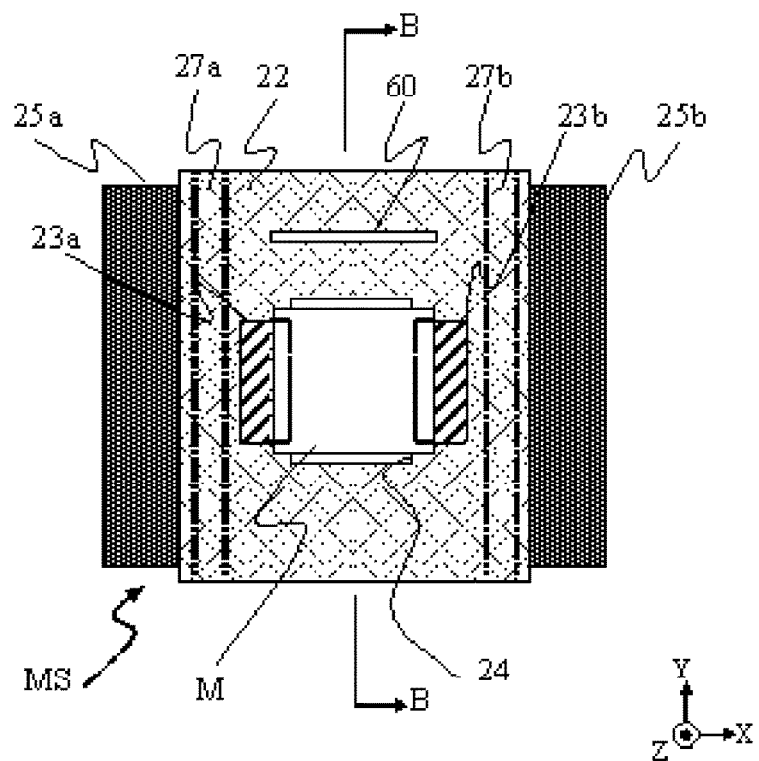
FIG. 3 is a plan view showing a mask stage according to the first embodiment.

FIG. 3 is a plan view showing the mask stage MS according to the present embodiment.

Figure 4:
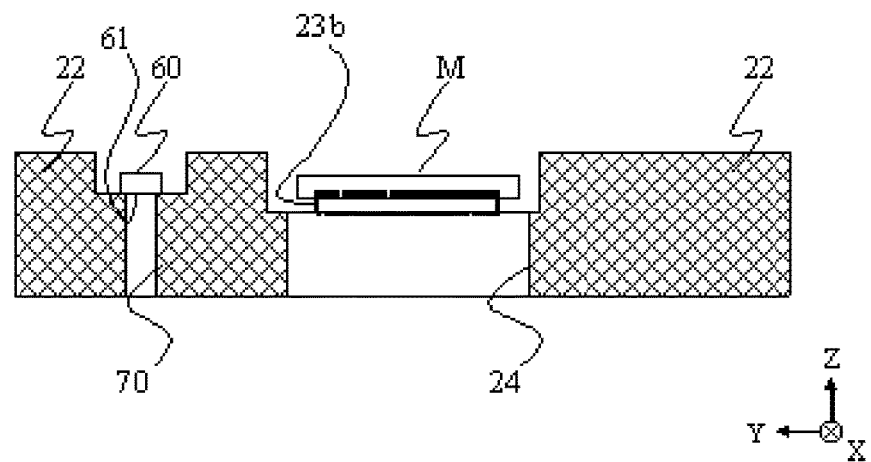
FIG. 4 is a cross-sectional view taken along B-B of the mask stage in FIG. 3.

FIG. 4 is a cross-sectional view taken along B-B of the mask stage MS in FIG. 3.

Figure 5:
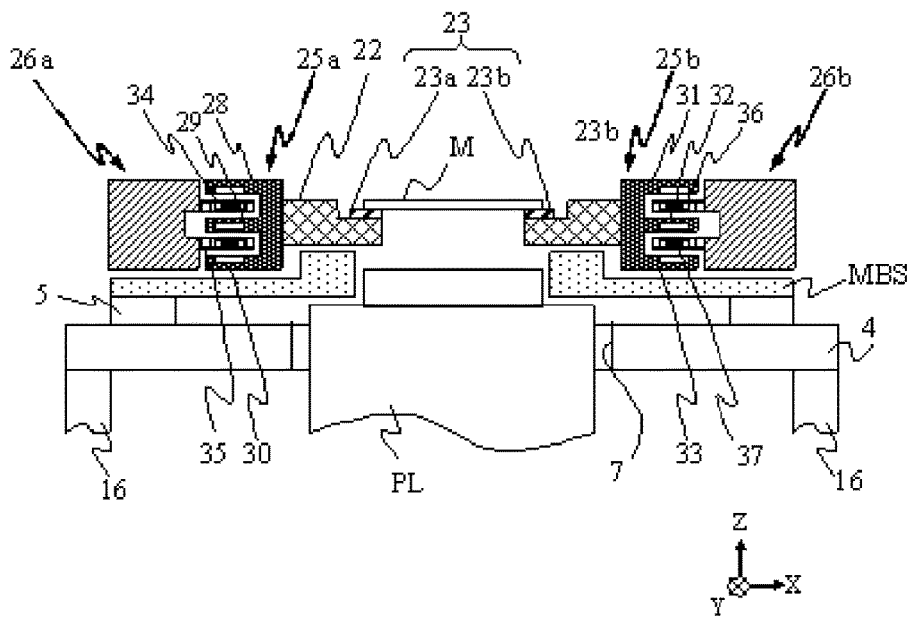
FIG. 5 is a cross-sectional view taken along A-A of the mask stage apparatus in FIG. 2.

FIG. 5 is a cross-sectional view taken along A-A of the mask stage apparatus 1 in FIG. 2.

As shown in FIG. 3, air-slider portions 27a and 27b are installed at regions opposite to each of the protruding portions MBSa and MBSb of the surface plate MBS at the rear surface (−Z side surface) of the stage main body 22.

In the air-slider portions 27a and 27b, an air supply groove (not shown) and a pair of air discharge grooves (not shown) positioned at both sides in the X axis direction of the air supply groove are formed over the entire length in the Y axis direction. An air supply port and a pair of air discharge ports are formed at each of the upper surface of the protruding members MBSa and MBSb of the surface plate MBS, which are opposite to at least a portion of each of the air supply groove and the pair of air discharge grooves respectively. In this way, in the present embodiment, a so-called differential discharge type gas hydrostatic bearing configured of a surface plate air-supply typeis used. For example, the differential discharge type gas hydrostatic bearing configured of a surface plate air-supply type is disclosed in U.S. Pat. No. 7,489,389.

Moreover, a reference member 60 is provided at the stage main body 22.

The reference member 60 is formed of low expansion glass having a small linear heat expansion coefficient. As shown in FIG. 4, a reference surface 61, which is the lower surface of the reference member 60, is provided at the stage main body 22 to be approximately flush with the lower surface (pattern surface) of the mask M. In the stage main body 22, an opening 70 is formed to correspond to the reference surface 61 of the reference member 60, the detection light is radiated (refer to FIG. 1) to the reference surface 61 and the lower surface (pattern surface) of the mask M via a plurality of optical systems (not shown), an opening (not shown) formed in the surface plate MBS, and the opening 70 formed in the stage main body 22 from between the surface plate MBS and the top plate portion 4, and a surface position measurement system (not shown) is provided near the mask stage apparatus 1 to detect the reference surface 61 and the lower surface (pattern surface) of the mask M.

As disclosed in PCT International Publication No. WO 2007/119821 (corresponding to United States Patent Application, Publication No. 2007/0291261), the surface position measurement system (not shown) emits the detection light to the reference surface of the reference member 60 and the lower surface (pattern surface) of the mask M, receives the reflected light, and thus, the surface position in the Z position of the lower surface (pattern surface) of the mask M is measured based on the surface position in the Z direction of the reference surface 61 of the reference member 60.

Moreover, in the present embodiment, the surface position measurement system (not shown) need not be provided near the mask stage apparatus 1. For example, the surface position measurement system may be provided at side the mask stage apparatus 1 to radiate the detection light to the reference surface 61 and the lower surface (pattern surface) of the mask M via the opening 70 and to measure the surface position of the lower surface (pattern surface) of the mask M.

Returning to FIG. 3, the movable elements 25a and 25b are fixed to the side surfaces of the −X side (−X side from the air-slider portion 27a) and the +X side (+side from the air-slider portion 27b) of the stage main body 22 respectively.

As shown in FIG. 5, one movable element 25a includes three movable element portions 28, 29 and 30 which are disposed to be parallel to each other with a predetermined interval in the Z axis direction and have the Y axis direction as the longitudinal direction. Here, three movable element portions 28, 29, and 30 are disposed symmetrically in the vertical direction based on a neutral surface (which passes through the center of gravity and is parallel to the XY plane) of the stage main body portion 22, and the neutral surface of the movable element portion positioned at the center coincides with the neutral surface of the stage main body 22.

Magnet units which include a plurality of permanent magnets arranged along the Y axis direction are built in each of the movable element portions 28, 29 and 30. Hereinafter, the magnet units are also indicated by magnet units 28, 29, and 30 using the same reference numerals as the corresponding movable element portions. Moreover, in the present embodiment, in the magnet unit 29 among the magnet units 28, 29, and 30, a protrusion (not shown) is provided at the center portion in the Y axis direction. One permanent magnet which has the Y axis direction as the longitudinal direction is accommodated in the protrusion (not shown).

The other movable element 25b is bilaterally symmetrical to the movable element 25a, a similar configuration, and includes three movable element portions 31, 32 and 33. Magnet units which include a plurality of permanent magnets arranged along the Y axis direction are built in each of the three movable element portions 31, 32 and 33. In the magnet unit 32 among the movable element portions 31, 32 and 33, that is, the magnet units 31, 32 and 33, a protrusion (not shown) is provided at the center portion in the Y axis direction. One permanent magnet which has the Y axis direction as the longitudinal direction is accommodated in the protrusion (not shown).

The stator 26a, which engages with the movable element 25a, includes a pair of stator portions 34 and 35 which are disposed to be parallel to each other with a predetermined interval in the Z axis direction. The stator portions 34 and 35 are supported to be fixed to the counter mass 3 (refer to FIG. 2).

Armature units, which include a plurality of armature coils arranged along the Y axis direction, are built in the inner portions of each of the stator portions 34 and 35. Hereinafter, the armature units are also indicated as armature units 34 and 35 using the same reference numerals as the corresponding stator portions. In addition, a single coil (not shown) having a long rectangular shape in the Y axis direction is accommodated at the −X side end portion in the inner portions of the stator portions 34 and 35.

The stator 26b which engages with the movable element 25b is bilaterally symmetrical to the stator 26a, has a similar configuration, and includes a pair of stator portions 36 and 37 which are disposed to be parallel to each other with a predetermined interval in the Z axis direction. The stator portions 36 and 37 are supported to be fixed to the counter mass 3 (refer to FIG. 2).

Armature units, which include a plurality of armature coils arranged along the Y axis direction, are built in the inner portions of each of the stator portions 36 and 37. Hereinafter, the armature units are also indicated as armature units 36 and 37 using the same reference numerals as the corresponding stator portions. In addition, a single coil (not shown) having a long rectangular shape in the Y axis direction is accommodated in the +X side end portion in the inner portions of the stator portions 36 and 37.

That is, in the present embodiment, four sets of Y linear motors are configured of six magnet units 28 to 33 and four armature units 34 to 37, and the controller CONT controls the four sets of Y linear motors via the mask stage-driving apparatus and drives the mask stage MS in the Y axis direction and the θZ direction.

In addition, in the present embodiment, the number of sets of Y linear motors is four, but need not be four. For example, the mask stage MS may be driven by three sets of Y linear motors, and the mask stage MS may be driven by one set of Y linear motors.

In addition, a total of two X voice coil motors, which are provided to be bilaterally symmetrical one by one, are configured of the above-described single coil (not shown) and the permanent magnet including the protrusion (not shown) in which upper and lower magnet surfaces are opposite to the coil.

The controller CONT supplies current to the single coil via the mask stage-driving apparatus (not shown), and can drive the mask stage MS in the X axis direction by two X voice coil motors.

Moreover, in the present embodiment, the number of X voice coil motors is two, but need not be two. For example, X voice coil motors are provided to be bilaterally symmetrical two by two, and thus, a total of four X voice coil motors may be configured, and a total of three X voice coil motors may be configured, in which one motor is disposed in the left and two motors are disposed in the right.

The mask-holding portion 23 is configured of a first mask-holding portion 23a (first holding portion) which holds the mask M in the −X side with respect to the opening 24, and a second mask-holding portion 23b (second holding portion) which holds the mask M in the +X side. A portion of the first mask-holding portion 23a and a portion of the second mask-holding portion 23b are inclined in directions different from each other. Accordingly, by deforming the mask M which is held to the first mask-holding portion 23a and the second mask-holding portion 23b, a change of the pattern image surface of the mask M can be corrected by an aberration change of the projection optical system PL.

The details of the mask-holding portion 23 will be described with reference to FIG. 6.

Figure 6:
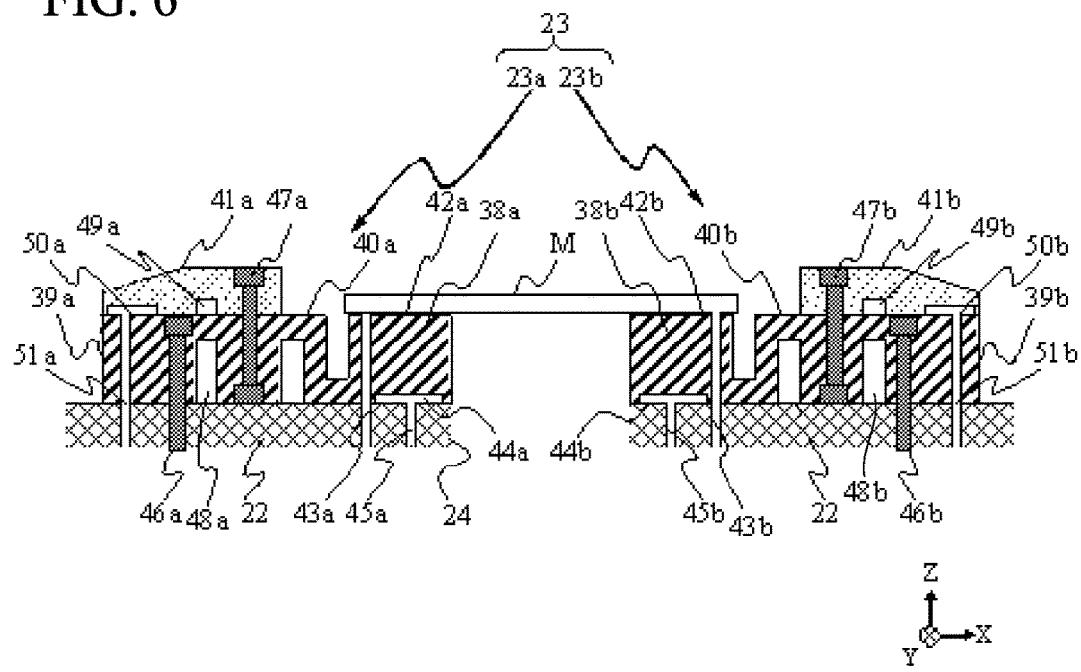
FIG. 6 is an enlarged cross-sectional view of a mask-holding portion in the mask stage in FIG. 4.

FIG. 6 is an enlarged cross-sectional view of the mask-holding portion 23 in the mask stage MS in FIG. 4.

In the present embodiment, the first mask-holding portion 23a and the second mask-holding portion 23b have a Z-axis symmetrical structure with respect to the opening 24. Hereinafter, the configuration of the first mask-holding portion 23a positioned in the −X side with respect to the opening 24 will be described. The descriptions of the configuration of the second mask-holding portion 23b are omitted. However, each configuration of the second mask-holding portion 23b is indicated by replacing suffixes of each configuration of the first mask-holding portion 23a from a to b.

The first mask-holding portion 23a includes a holding portion 38a (first member) which holds the lower surface of the mask M, a lower block portion 39a (second member) in which a portion is fixed to the stage main body 22, a hinge portion 40a (connection member, support portion) which is a support portion supporting the holding portion 38a to change the position (a relative positional relationship between the holding portion 38a and the lower block portion 39b changes) of the holding portion 38a along the X axis direction with respect to the lower block portion 39a according to deformation of the mask M, and an upper block portion 41a in which a portion is fixed to the lower block portion 39a and which is disposed at the upper surface of the lower block portion 39a.

The holding portion 38a is configured of a holding surface 42a which holds the mask M by vacuum suction, a mask suction tube 43a which is formed to passthrough the holding portion 38a and the stage main body 22 from the holding surface 42a and communicates with a vacuum apparatus (not shown), a first suction pocket 44a (action surface) which is formed on the lower surface of the holding portion 38a and forms a predetermined space between the first suction pocket and the upper surface of the stage main body 22, and a first communication tube 45a (gas flow port) which passes through the stage main body 22 from the first suction pocket 44a and communicates with the vacuum apparatus (not shown).

The holding surface 42a has high flatness, sets the mask suction tube 43a to a predetermined negative pressure, and thus, suctions and holds the mask M which is disposed on the holding surface 42a. Moreover, the first communication tube 45a is formed in plural along the Y axis direction. Furthermore, in the present embodiment, a gap (an interval between the upper surface of the stage main body 22 and the surface of the first suction pocket 44a opposite to the upper surface of the stage main body 22) of the first suction pocket 44a is 10 μm. Moreover, in the present embodiment, a pressure, which can be set in the first suction pocket 44a via the first communication tube 45a, is 0 Pa to −55 kPa, and the plurality of first communication tubes 45a can set intake pressures independently of one another. The first suction pocket 44a and the first communication tube 45a will be described below.

The lower block portion 39a is fixed to the stage main body 22 by the first connection portion 46a, and the lower block portion 39a and the upper block portion 41a are fixed to each other by a second connection portion 47a. Moreover, a first slit 48a is formed so that an opening is formed in the stage main body 22 side. In the upper block portion 41a, a second slit 49a is formed so that an opening is formed on the upper surface side of the lower block portion 39a to correspond to the first slit 48a in the Z direction. Moreover, a second suction pocket 50a (action surface) is formed between the lower surface of the upper block portion 41a and the upper surface of the lower block portion 39a, and a second communication tube 51a (gas flow port) is formed which passes through the lower block portion 39a and the stage main body 22 from the second suction pocket 50a and communicates with the vacuum apparatus (not shown).

The second communication tube 51a is formed in plural along the Y axis direction. Furthermore, in the present embodiment, a gap (an interval between the upper surface of the lower block portion 39a and the surface of the second suction pocket 50a opposite to the upper surface of the lower block portion 39a) of the second suction pocket 50a is 10 μm. In addition, in the present embodiment, similar to the inner portion of the first suction pocket 44a, a pressure, which can be set in the second suction pocket 50a via the second communication tube 51a, is 0 Pa to −55 kPa. The plurality of second communication tubes 51a can set intake pressures independently of one another. The second suction pocket 50a and the second communication tube 51a will be described below.

In the present embodiment, the hinge portion 40a is a support portion which connects the holding portion 38a and the lower block portion 39a. The hinge portion 40a is integrally formed with the holding portion 38a and the lower block portion 39a. The hinge portion 40a, the holding portion 38a, and the lower block portion 39a are formed of ceramic. In the present embodiment, the lower block portion 39a is fixed to the stage main body 22 by the first connection portion 46a. Accordingly, the hinge portion 40a is connected between the holding portion 38a and the lower block portion 39a so that the holding portion 38a is able to displace in the X axis direction with respect to the lower block portion 39a.

The first suction pocket 44a, the first communication tube 45a, the second suction pocket 50a, and the second communication tube 51a will be described with reference to FIG. 7.

FIG. 7 is an enlarged cross-sectional view of the mask-holding portion 23 showing an example of deformation of the mask M in the present embodiment.

Figure 7A:
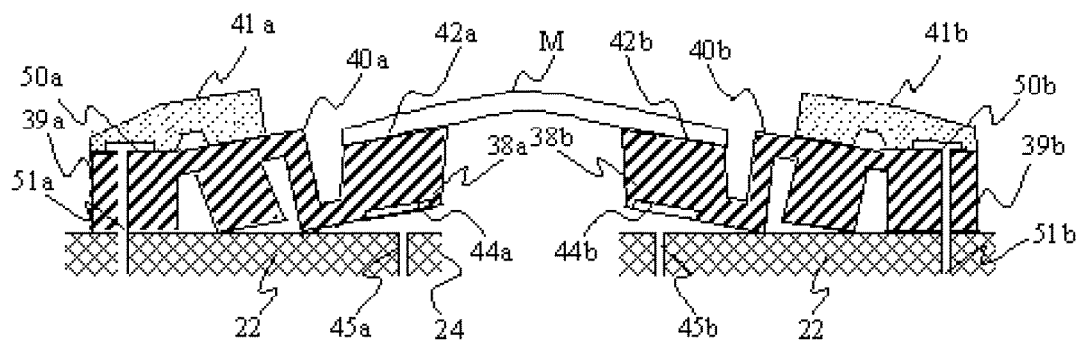
FIG. 7A is an enlarged cross-sectional view of a mask-holding portion showing an example of deformation of a mask according to the first embodiment.

In the present embodiment, the intake pressures of the first communication tube 45a and the second communication tube 51a each are configured so as to be adjusted independently. As shown in FIG. 7A, the intake pressure of the second communication tube 51a is set to be higher than the intake pressure of the first communication tube 45a to generate a predetermined differential pressure, and thus, the holding portion 38a is driven counterclockwise (the holding portion 38a is inclined to rise in the +X direction) around the Y axis with the first connection portion 46a (not shown in FIG. 7A), in which the lower block portion 39a is fixed to the stage main body 22, as the supporting point. In other words, the holding portion 38a is inclined to be made higher in a portion positioned in the +X direction side. Accordingly, a counterclockwise bending moment is affected around the Y axis in the −X side end portion of the mask M.

In addition, as described above, the configuration of the first mask-holding portion 23a and the configuration of the second mask-holding portion 23b in the present embodiment are Z-axis symmetrical with respect to the opening 24. Accordingly, similar to the first mask-holding portion 23a, also in the second mask-holding portion 23b, the intake pressure of the second communication tube 51b (gas flow port) is set to be higher than the intake pressure of the first communication tube 45b (gas flow port) to generate a predetermined differential pressure, and thus, the holding portion 38b (first member) is driven clockwise (the holding portion 38b is inclined to lower in the +X direction) around the Y axis with the first connection portion 46b, in which the lower block portion 39b (second member) is fixed to the stage main body 22, as the supporting point. In other words, the holding portion 38b is inclined to be made higher in a portion positioned in the −X direction side. Accordingly, a clockwise bending moment is affected around the Y axis in the end portion of the +X side of the mask M.

That is, since the first mask-holding portion 23a and the second mask-holding portion 23b which hold the mask M are inclined in directions different from each other, the mask M is deformed to be a protruding shape in the +Z direction. Here, the bending moment is a force which deforms the mask M.

Figure 7B:
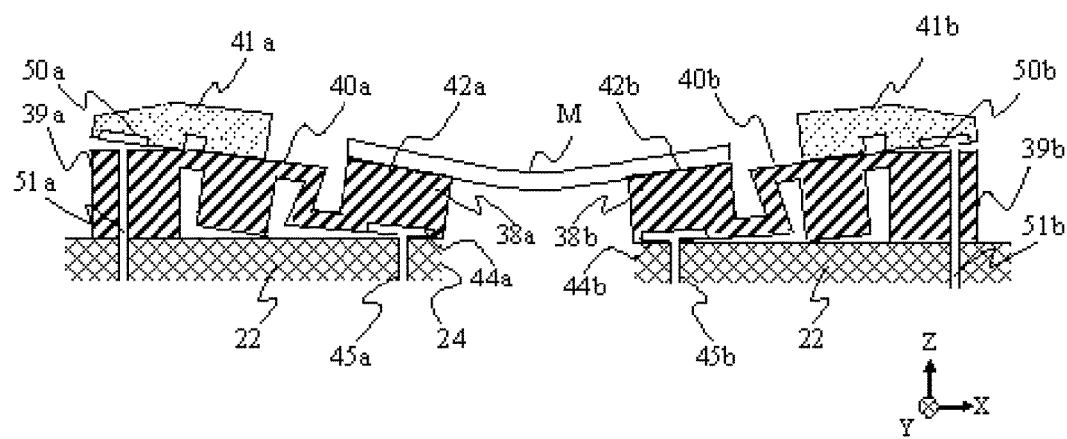
FIG. 7B is an enlarged cross-sectional view of the mask-holding portion showing the example of the deformation of the mask according to the first embodiment.

On the other hand, as shown in FIG. 7B, the intake pressure of the second communication tube 51a is set to be lower than the intake pressure of the first communication tube 45a to generate a predetermined differential pressure, and thus, the holding portion 38a is driven clockwise (the holding portion 38a is inclined to lower in the +X direction) around the Y axis with the first connection portion 46a (not shown in FIG. 7B), in which the lower block portion 39a is fixed to the stage main body 22, as the supporting point. In other words, the holding portion 38a is inclined to be made higher in a portion positioned in the −X direction side. Accordingly, a clockwise bending moment is affected around the Y axis at the −X side end portion of the mask M. Moreover, in the second mask-holding portion 23b which is positioned in the +X side with respect to the opening 24, a differential pressure similar to the above is set, and thus, the holding portion 38b is driven counterclockwise (the holding portion 38b is inclined to rise in the +X direction) around the Y axis with the first connection portion 46b, in which the lower block portion 39b is fixed to the stage main body 22, as the supporting point. In other words, the holding portion 38b is inclined to be made higher in a portion positioned in the +X direction side.

Accordingly, a counterclockwise bending moment is affected around the Y axis in the end portion of the +X side of the mask M. Therefore, the mask M is deformed to be a protruding shape in the −Z direction.

For example, when the mask M is deformed from the shape (refer to FIG. 6) parallel to the X axis to the protruding shape in the +Z direction (refer to FIG. 7A), the intake pressure of the second communication tube 51a is set to be higher than that of the first communication tube 45a, and posture (inclination or the like) of the holding portion 38a (holding surface 42a) is changed to rise in the +X direction from the shape parallel to the X axis. At this time, the −X side end portion of the mask M is displaced in the +X direction with respect to the stage main body 22 as a change amount of the inclination (posture) of the holding portion 38a is increased. According to a displacement amount of the −X side end portion of the mask M, the hinge portion 40a connected to the holding portion 38a extends in the +X direction with respect to the lower block 39a. That is, the relative positional relationship between the holding portion 38a and the lower block 39a is changed via the hinge portion 40a.

On the other hand, when the mask M is deformed from the protruding shape (refer to FIG. 7A) in the +Z direction to the shape (refer to FIG. 6) parallel to the X axis, the intake pressure of the first communication tube 45a and the intake pressure of the second communication tube 51a are the same as each other, and thus, the inclination (posture) of the holding portion 38a (holding surface 42a) is changed from the state of rising in the +X direction to the state of being parallel to the X axis. At this time, the −X side end portion of the mask M is displaced in the −X direction with respect to the stage main body 22 as the change amount of the inclination (posture) of the holding portion 38a is increased. According to a displacement amount of the −X side end portion of the mask M, the hinge portion 40a connected to the holding portion 38a is contracted in the −X direction with respect to the lower block 39a. That is, the relative positional relationship between the holding portion 38a and the lower block 39a is changed via the hinge portion 40a.

That is, in the present embodiment, the hinge portion 40a is connected to the holding portion 38a so that the position of the holding portion 38a is changed along the X axis direction according to the change of the inclination (posture) of the holding portion 38a (holding surface 42a).

Accordingly, a shearing force, which is generated in the X axis direction in an interface between the holding surface 42a of the holding portion 38a and the mask M, can be suppressed. Therefore, since a force (for example, the suction force) holding the mask M in the holding portion 38a is not decreased also by the shearing force which is generated at the interface between the holding surface 42a and the mask M, the mask M can be deformed to a desired shape without being detached from the holding portion 38a. Accordingly, the change of the pattern image surface of the mask M due to the aberration change of the projection optical system PL can be sufficiently corrected, and the pattern formed on the mask M can be precisely exposed to the substrate W.

Moreover, according to the differential pressure between the intake pressure of the first communication tube 45a and the intake pressure of the second communication tube 51a, a slit interval between the first slit 48a and the second slit 49a is expanded and contracted, and thus, a movable range of the first mask-holding portion 23a is increased, and the bending moment around the Y axis can be effectively affected to the mask M.

Moreover, in the present embodiment, the suction pressures of the first communication tube 45a and the second communication tube 51a are −55 kPa at maximum. However, the suction pressures need not be −55 kPa and may be further increased according to the deformation amount of the mask M.

Furthermore, in the present embodiment, negative pressures are set in the first suction pocket 44a and the second suction pocket 50a. However, positive pressures may be set. When the positive pressures are set, a compression apparatus may be connected to the first communication tube 45a and the second communication tube 51a.

In addition, in the present embodiment, the first suction pocket 44a and the first communication tube 45a, and the second suction pocket 50a and the second communication tube 51a form two driving units which drive the holding portion 38a independently. However, the number of the driving units need not be two. For example, the number of the driving units may be three or more, and the holding portion 38a can be driven with higher accuracy by increasing the driving units.

Moreover, in the present embodiment, the first suction pocket 44a and the second suction pocket 50a communicate with the first communication tube 45a and the second communication tube 51a, respectively. However, the first suction pocket 44a and the second suction pocket 50a need not be present, and one of either may be present. For example, when the first suction pocket 44a is not present, the other end of the first communication tube 45a connected to the vacuum apparatus (not shown) is connected to the lower surface of the holding portion 38a, and a negative pressure is set in the first communication tube 45a.

Moreover, in the present embodiment, gaps of the first suction pocket 44a and the second suction pocket 50a are 10 μm. However, the gaps need not be 10 μm. Moreover, the gaps of the first suction pocket 44a and the second suction pocket 50a may be different from each other.

Furthermore, in the present embodiment, the hinge portion 40a is integrally formed with the lower block portion 39a and the holding portion 38a. However, the hinge portion need not be integrally formed. For example, the hinge portion 40a is formed of a plate spring as a separate member, and may be fixed to the lower block portion 39a and the holding portion 38a. For example, the separate member may be stainless steel or titanium.

In addition, in the present embodiment, first slits 48a are provided at the lower block portion 39a of the first mask-holding portion 23a, and second slits 49a are provided at the upper block portion 41a. However, the slits need not be provided. Moreover, in the present embodiment, single slit is cutted as the first slits 48a and the second slits 49a respectively. However, the slits need not be provided single, and may be cut in plurality.

Figure 8:
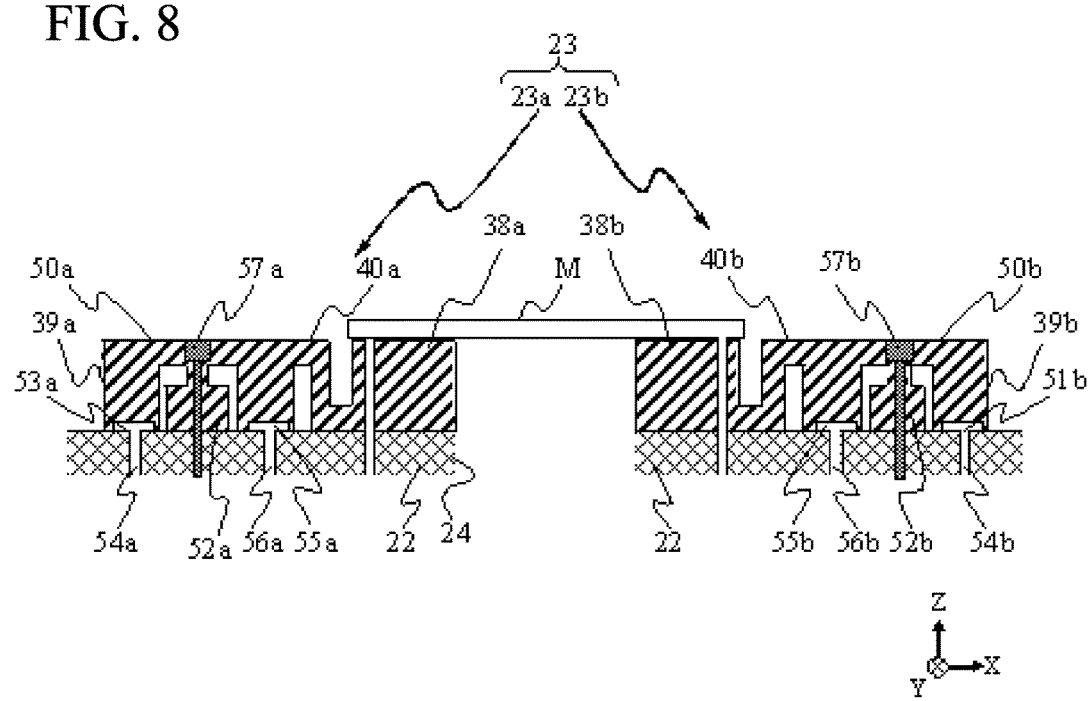
FIG. 8 is an enlarged cross-sectional view showing another example of the mask-holding portion according to the first embodiment.

Moreover, instead of the slits, a configuration shown in FIG. 8 may be adopted. The configuration of FIG. 8 is different from that of FIG. 6 in that a rotating portion 52a, which is formed at a block portion 50a and is fixed to the stage main body 22 by a third connection portion 57a, is provided. A third communication tube 54a (gas flow port) and a fourth communication tube 56a, which are connected to the vacuum apparatus (not shown) in the left and right of the rotating portion 52a, oppositely communicate with the third suction pocket 53a (action surface) and the fourth suction pocket 55a (action surface), respectively. In the case of this configuration, according to the differential pressure between the intake pressure of the third suction pocket 53a and the intake pressure of the fourth suction pocket 55a, the holding portion 38a is driven with the rotating portion 52a as the supporting point, and a clockwise or counterclockwise bending moment in the Y axis is affected to the mask M.

Furthermore, in the present embodiment, the hinge portion 40a need not be a hinge as long as the hinge portion is at least an elastic body which is displaced in the X axis direction. For example, a spring member may be used, and the hinge and the spring member may be combined.

Moreover, in the present embodiment, as the driving units which drive the holding portion 38a, the first suction pocket 44a and the second suction pocket 50a, and the first communication tube 45a and the second communication tube 51a which are opposite to the suction pockets and suction the pockets are adopted. However, the holding portion 38a need not be driven by the intake pressure described above.

For example, the holding portion 38a may be driven using an electromagnetic force. For example, in this case, magnets are positioned at the positions of the first suction pocket 44a and the second suction pocket 50a, and two voice coil motors are configured by installing coils to each of the stage main body 22 opposite to the magnet provided at the first suction pocket 44a and the upper surface of the lower block portion 39a opposite to the magnet provided at the second suction pocket 50a, and thus, the holding portion 38a may be driven by the electromagnetic force from the voice coil motors.

Furthermore, for example, the holding portion 38a may be driven using a piezoelectric element. For example, in this case, piezo elements are installed at positions of the first suction pocket 44a and the second suction pocket 50a, respectively, and the holding portion 38a may be driven by pressing the surfaces opposite to respective piezo elements.

Next, an example of a basic operation of the exposure apparatus EX including the above-described configuration will be described with reference to FIG. 9.

Figure 9:
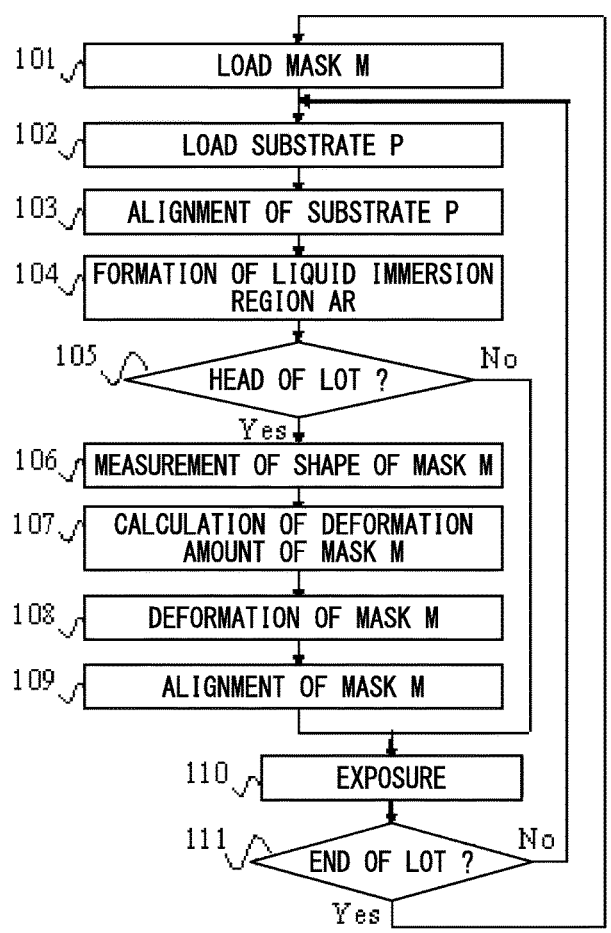
FIG. 9 is a flowchart for illustrating an example of an operation of the exposure apparatus according to the first embodiment.

FIG. 9 is a schematic flowchart for illustrating an example of the operation of the exposure apparatus EX in the present embodiment, and shows an example of a process of a basic exposure processing.

First, the mask M is transported to the holding portion 38a (38b) of the mask stage MS by driving of a transportation system including a robot arm (not shown), and is suctioned and held (Step 101).

Subsequently, the substrate W is loaded on the substrate table WT by the driving of the transportation system including the robot arm (not shown) (Step 102).

Alignment of the loaded substrate W is performed (Step 103). Specifically, first, a plurality of substrate alignment marks (not shown) formed on the plurality of exposure regions (shot) of the substrate W are detected by a substrate alignment system WA, and arrangements of all exposure regions (shot) of the substrate W are assumed by performing Enhanced Global Alignment (EGA) processing disclosed in Japanese Unexamined Patent Application, First Publication No. S6144429 (corresponding to U.S. Pat. No. 4,780,617). Subsequently, the substrate reference mark (not shown) provided on the substrate table WT is detected by the substrate alignment system WA, and a positional relationship between the substrate alignment system WA and the substrate reference mark is measured. Moreover, in Step 103, during EGA processing and while the substrate reference mark is detected, the positions (focus positions) and postures (θX, θY) in the Z direction of each exposure region (shot) of the substrate W are sequentially measured.

Subsequently, the liquid immersion region AR is formed (Step 104). Specifically, a liquid supply operation to the substrate W (substrate table WT) starts by the driving of the liquid supply apparatus, a liquid recovery operation from the substrate W (substrate table WT) starts by the driving of the liquid recovery apparatus, and thus, the liquid immersion region AR is formed between the lower surface of the liquid immersion apparatus 15 and the lower surface of the terminal optical element 14 (lower surface of the projection optical system PL), and the substrate W (substrate table WT).

Subsequently, it is determined whether or not the substrate W subjected to the exposure from now on is the first substrate of a lot (Step 105).

In Step 105, when it is determined that the substrate W subjected to the exposure from now on is the first substrate of the lot, the Z position of the lower surface (pattern surface) of the mask M with respect to the reference surface 61 of the reference member 60 is measured and the displacement amount in the Z direction of the mask M with respect to the reference surface 61 is measured (Step 106) by a surface position measurement system (not shown). More specifically, the mask stage MS is driven via the mask stage-driving apparatus (not shown) by the controller CONT, and the detection light is sequentially radiated to a plurality of points of the reference surface 61 of the reference member 60 and the lower surface (pattern surface) of the mask M by the surface position measurement system (not shown). Subsequently, the Z position of the lower surface (pattern surface) of the mask M with respect to the reference surface 61 is measured by receiving the reflected light, and the shape of the mask M is measured.

Subsequently, the deformation amount in which the mask M is deformed by the mask-holding portion 23 is obtained (Step 107).

In this step, based on the provisional deformation amount of the mask M and the shape of the mask M measured in Step 106 in the provisional deformation amount of the mask M for correcting the change of the pattern image surface of the mask M and the set value of the lens controller LC which are precalculated, the deformation amount of the mask M which is deformed by the mask-holding portion 23 in the later Step 108 is calculated.

Moreover, the provisional deformation amount of the mask M and the set value of the lens controller LC, which are precalculated, are obtained so that the change amount of the pattern image surface of the mask M is obtained by the aberration change of the projection optical system PL when the substrates having the lot sheets in an arbitrary lot are exposed, and the change of the pattern image surface is decreased. That is, in the present embodiment, the provisional deformation amount of the mask M and the set value of the lens controller are calculated in advance for each lot.

Moreover, for example, with the measurement of the aberration change of the projection optical system PL, a measurement apparatus of PCT International Publication No. WO 2006/016584 (corresponding to U.S. Pat. No. 7,667,829) is used.

Subsequently, the holding portion 38a (38b) is inclined based on the deformation amount of the mask M calculated in Step 107, and thus, the mask M is deformed (Step 108). Moreover, in the present step, the lens controller LC is set based on the set value of the lens controller LC calculated in Step 107. That is, in the present embodiment, the change of the pattern image surface of the mask M is corrected by making the deformation of the shape of the mask M and the lens controller LC cooperate.

Subsequently, the alignment of the loaded mask M is performed (Step 109). Specifically, the mask alignment mark (not shown) formed on the mask M and the mask reference mark (not shown) provided on the substrate table WT are simultaneously detected by the mask alignment system MA via the liquid immersion region AR formed in Step 104 and the projection optical system PL, and the positional relationship between the mask alignment mark and the mask reference mark is measured. At this time, according to the positional relationship between the substrate alignment system WA and the substrate reference mark measured in Step 103 and the positional relationship between the mask alignment mark and the mask reference mark measured in the present Step 109, the positional relationship between the substrate alignment system WA and the mask alignment mark is calculated, and a baseline amount which is an interval between the substrate alignment system WA and the pattern image of the mask M is calculated.

Then, based on the arrangement of the exposure region (shot) assumed in Step 103, the position (focus position) and the posture (θX, θY) in the Z direction of each exposure region (shot) measured in Step 103, and the baseline amount measured in Step 109, the pattern image of the mask M is sequentially exposed to each exposure region (each shot) on the substrate W (Step 110).

On the other hand, in Step 105, when it is determined that the substrate W subjected to the exposure from now on is not the first substrate of the lot, the substrate W is exposed via the liquid immersion region AR (Step 110).

In addition, after the substrate W is exposed in Step 110, it is determined whether or not the substrate W is the final substrate in the lot (Step 111).

When it is determined that the substrate W is the final substrate in the lot in Step 111, the used mask M is unloaded from the mask stage MS, and a new mask M is loaded in the mask stage MS in Step 101.

On the other hand, when it is determined that the substrate W is not the final substrate in the lot in Step 111, a new substrate W is loaded on the substrate table WT in Step 102.

In the operation of the exposure apparatus EX of the present embodiment described above, by changing the mask M to a desired shape (while cooperating with the lens controller LC) according to the change of the pattern image surface of the mask M due to the aberration change of the projection optical system PL, the change of the pattern image of the mask M is sufficiently corrected, and the pattern formed on the mask M can be precisely exposed to the substrate W.

In addition, in the present embodiment, the set value of the lens controller LC and the deformation amount of the shape of the mask M are calculated for each lot, but need not be calculated for each lot. For example, the set value and the deformation amount may be calculated for each exposed substrate, and thus, the lens controller LC and the shape of the mask M may be set for each substrate.

Furthermore, in the present embodiment, the provisional deformation amount of the mask M and the set value of the lens controller LC for correcting the change of the pattern image surface of the mask M are calculated in advance. However, by measuring the aberration of the projection optical system PL at a predetermined timing during the exposure processing of the substrate W (from Step 101 to Step 110), the set value of the lens controller LC and the deformation amount of the mask M may be obtained to correct the image surface shape of the pattern image of the mask M due to the aberration.

Moreover, in the present embodiment, the change of the pattern image surface of the mask M is corrected by making the setting of the lens controller LC and the deformation of the shape of the mask M cooperate with each other. However, the correction may be performed by deforming only the shape of the mask M without using the lens controller LC.

In this case, the provisional deformation amount of the mask M, which corrects the change of the pattern image surface of the mask M by the aberration change of the projection optical system PL when the substrates having the lot sheets in an arbitrary lot are exposed, is obtained in advance. Based on the provisional deformation amount of the mask M and the shape of the mask M measured in Step 106, the deformation amount of the mask M which is deformed by the mask-holding portion 23 is calculated in Step 108, and the mask M may be deformed.

Modification

Next, a modification of the mask-holding portion 23 of the present embodiment will be described with reference to FIGS. 10 and 11.

Figure 10:
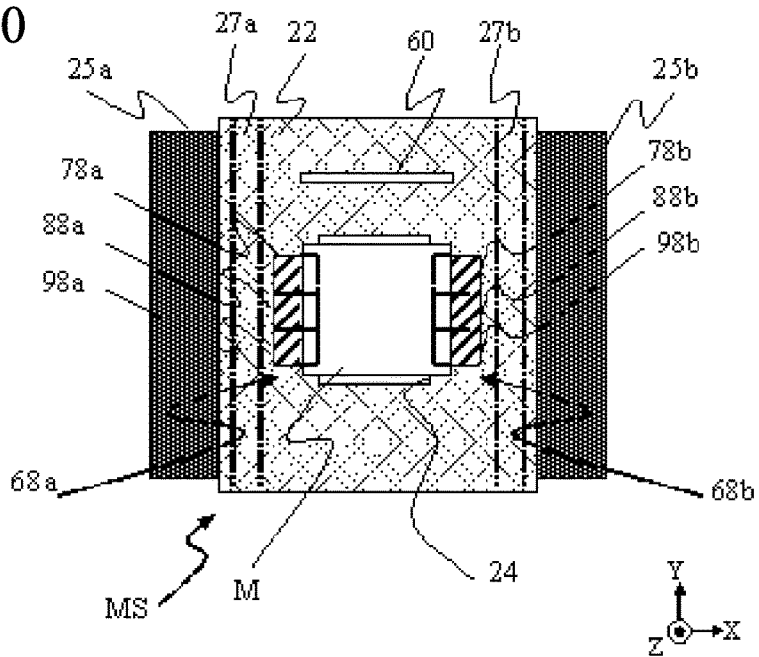
FIG. 10 is a modification of the mask-holding portion according to the first embodiment.

FIG. 10 is a modification of the mask-holding portion 23 according to the first embodiment.

Figure 11A:
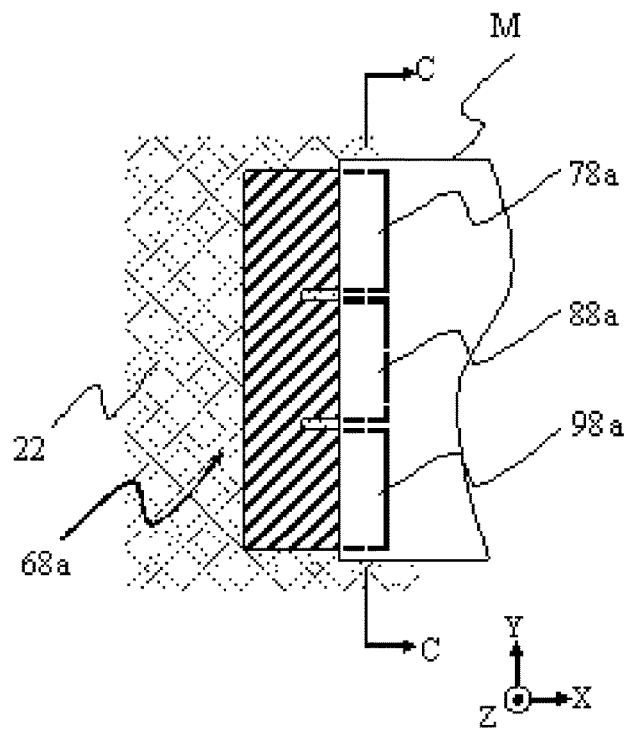
FIG. 11A is an enlarged view of the mask-holding portion in FIG. 10.
Figure 11B:
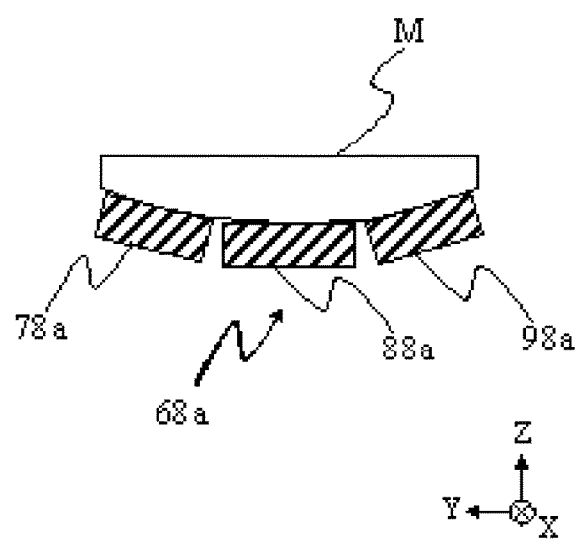
FIG. 11B is a cross-sectional view taken along C-C in the enlarged view of the mask-holding portion in FIG. 11A.

FIG. 11A is an enlarged view of a first mask-holding portion 68a (first holding portion) of FIG. 10, and FIG. 11B is a cross-sectional view taken along C-C in the enlarged view of the first mask-holding portion 68a of FIG. 11A.

As shown in FIG. 10, in this modification, the configurations different from those of the mask-holding portion 23 (refer to FIGS. 3 and 6) are that the first mask-holding portion 68a including division-holding portions 78a, 88a, and 98a divided into three along the Y axis, and the second mask-holding portion 68b (second holding portion) including division-holding portions 78b, 88b, and 98b are provided.

Since the first mask-holding portion 68a and the second mask-holding portion 68b have the Z-axis symmetrical structure with respect to the opening 24, only the first mask-holding portion 68a will be described.

As shown in FIG. 11A, the first mask-holding portion 68a includes the division-holding portions 78a, 88a, and 98a which suctions and holds the −X side end portion of the mask M at three places along the Y axis. The hinge portion 40a (not shown in FIG. 11) shown in FIG. 6 is connected to each of the division-holding portions 78a, 88a, and 98a. In this modification, the hinge portion 40a is connected to each of the division-holding portions 78a, 88a, and 98a so that each of the holding surfaces holding the mask M of the division-holding portions 78a, 88a, and 98a is inclined in the Y axis direction.

According to this configuration, with respect to the configuration which holds the mask M on the flat surface, as shown in FIG. 11B, the mask M can be suctioned and held by the division-holding portions 78a, 88a, and 98a according to the shape of the lower surface of the mask M, and thus, distortion occurring in the held mask M can be suppressed.

Therefore, the deformation of the shape of the mask M in Step 108 in FIG. 9 can be easily performed.

Second Embodiment

Next, a second embodiment of the present invention will be described with reference to FIG. 12.

In descriptions below, the same reference numerals are assigned to the same or the equivalent components as the above-described embodiment, and the descriptions are simplified or omitted.

Figure 12:
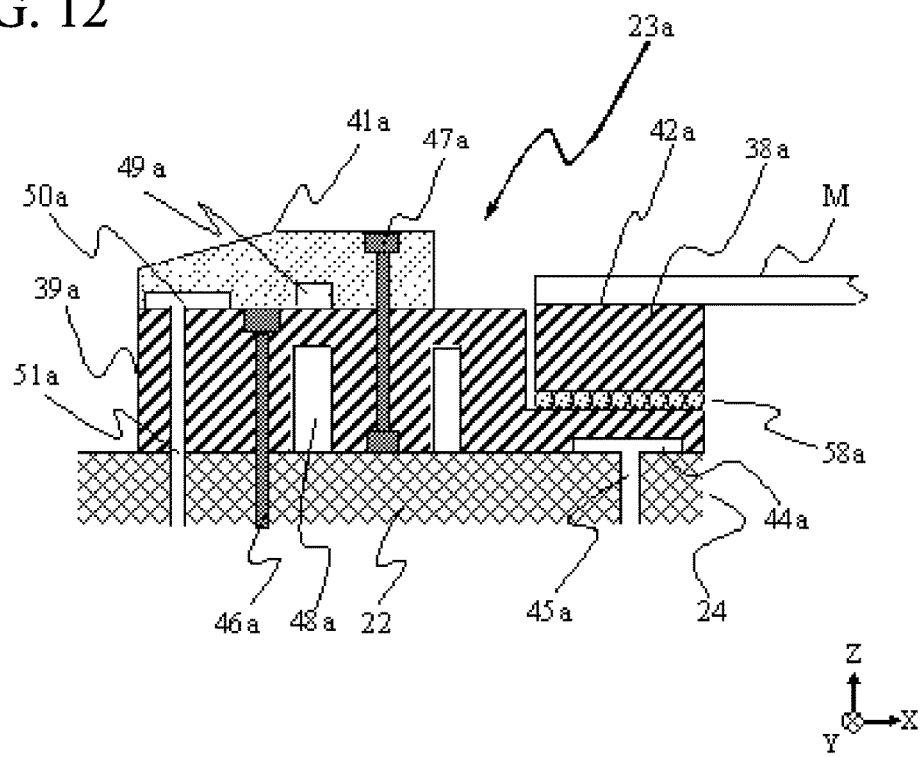
FIG. 12 is an enlarged cross-sectional view of the mask-holding portion of −X side according to a second embodiment.

FIG. 12 is an enlarged cross-sectional view of the first mask-holding portion 23a of the −X side according to the present embodiment.

In the present embodiment, since the first mask-holding portion 23a and the second mask-holding portion 23b have the Z-axis symmetrical structure with respect to the opening 24, descriptions of the configuration of the second mask-holding portion 23b are omitted.

As shown in FIG. 12, in the first mask-holding portion 23a of the present embodiment, instead of the hinge portion 40a (refer to FIG. 6) of the first embodiment, a guide portion 58a (guide member) is disposed between the lower block portion 39a and the holding portion 38a as a support portion which supports the holding portion 38a in a freely displaceable manner in the X axis direction.

The guide portion 58a is a linear guide which is configured of a rail (not shown) extending in the X axis direction and a movable body (not shown) fitted to the rail. In order to decrease the sliding friction between the rail and the movable body, the movable body is fitted to the rail via a plurality of balls (rolling elements) which roll along the X axis direction and can move on the rail along the X axis direction.

For example, in this case, the intake pressure of the second communication tube 51a is set to be higher than the intake pressure of the first communication tube 45a to generate a predetermined differential pressure, and thus, the holding portion 38a is driven counterclockwise (the holding portion 38a is inclined to rise in the +X direction) around the Y axis, and a counterclockwise bending moment is affected in the Y axis in the −X side end portion of the mask M (refer to FIG. 7A). At this time, the − side end portion of the mask M is displaced by a predetermined displacement amount in the +X direction, and the holding portion 38a fixed to the movable body (not shown) of the guide portion 58a is displaced in the +X direction with respect to the lower block portion 39a according to the predetermined displacement amount.

That is, in the present embodiment, the guide portion 58a changes the position of the holding portion 38a in the X axis direction according to the inclination (posture) of the holding portion 38a.

In the present embodiment, the guide portion 58a supports the holding portion 38a to be approximately independent of other configurations (for example, the lower block portion 39a). Accordingly, when the holding portion 38a is displaced, it is possible to smoothly change the position of the holding portion 38a in the X axis direction without affecting stress to other configurations.

As described above, in the interface between the mask M and the holding surface 42a of the holding portion 38a, the shearing force occurring in the X axis direction can be suppressed, and the mask M can be deformed to a desired shape. Accordingly, the change of the pattern image surface of the mask M due to the aberration change of the projection optical system PL can be sufficiently corrected, and the pattern formed on the mask M can be precisely exposed to the substrate W.

Furthermore, in the present embodiment, the holding portion 38a is fixed to the movable body (not shown) of the guide portion 58a. However, the movable body may be set to the holding portion 38a.

Moreover, in the present embodiment, the linear guide, which uses the plurality of rolling elements rolling in the X axis direction as the support portion supporting the holding portion 38a in a freely displaceable manner in the X axis direction, is adopted. However, for example, an air guide, which supports the holding portion 38a in a non-contact manner with respect to the lower block portion 39a by air pressure and in a freely displaceable manner in the X axis direction, may be used, and a single-axis linear motor, which moves the holding portion 38a in the X axis direction by an electromagnetic force, may be adopted. When the single-axis linear motor is adopted, a movement amount in the X axis direction of the holding portion 38a is controlled by the controller CONT (refer to FIG. 1) according to the displacement amount in the X direction of the end portion of the mask M which is displaced by the bending moment.

Furthermore, for example, the present invention may be applied to an exposure apparatus in which patterns of two masks are combined on the substrate via the projection optical system and one shot region on the substrate is approximately simultaneously double-exposed by single scanning exposure, as disclosed in U.S. Pat. No. 6,611,316, or the like. Moreover, the present invention may be also applied to an exposure apparatus of a proximity system, a mirror projection aligner, or the like.

Furthermore, the present invention may be also applied to an exposure apparatus of a twin-stage type which includes a plurality of substrate stages, as disclosed in U.S. Pat. No. 6,400,441, PCT International Publication No. WO 98/28665, U.S. Pat. Nos. 6,341,007, 6,400,441, 6,549,269, 6,590,634, 6,208,407, 6,262,796, or the like.

Moreover, the kind of exposure apparatus EX is not limited to the exposure apparatus for manufacturing a semiconductor element which exposes a semiconductor element pattern on the substrate W, and the exposure apparatus EX may be also widely applied to an exposure apparatus for manufacturing a liquid crystal display element or a display, or an exposure apparatus for manufacturing a thin film magnetic head, an imaging element (CCD), a micromachine, a MEMS, a DNA chip, a reticle, a mask, or the like.

Furthermore, in each of the above-described embodiments, respective positions of the mask stage MS and the substrate table WT are measured using the mask side laser interferometer 19 and the substrate side laser interferometer 17. However, the present invention is not limited to this, and for example, an encoder system which detects scale (diffraction grating) provided at the mask stage MS and the substrate table WT may be used. In this case, it is preferable to adopt a hybrid system, which includes both of at least one of the mask side laser interferometer 19 and the substrate side laser interferometer 17, and the encoder system, and performing a correction (calibration) of the measured results of the encoder system by using the results of at least one of the mask side laser interferometer 19 and the substrate side laser interferometer 17. In addition, the positional control of the stage may be performed by using at least one of the mask side laser interferometer 19 and the substrate side laser interferometer 17 and the encoder system while switching with each other, or using both of at least one of the mask side laser interferometer 19 and the substrate side laser interferometer 17 and the encoder system.

Furthermore, in the above-described embodiments, ArF excimer laser is used. However, for example, as disclosed in U.S. Pat. No. 7,023,610, a harmonic generation apparatus may be used, which includes a solid laser light source such as a DFB semiconductor laser or a fiber laser, light amplification portion having a fiber amplifier or the like, a wavelength conversion portion, or the like, and outputs a pulse light having a wavelength of 193 nm. Moreover, in the above-described embodiments, each illumination region and each projection region described above have a rectangular shape, however, they may have other shapes, for example, an arc shape or the like.

Moreover, in each embodiment described above, the light transmission type mask is used in which a predetermined light-shielding pattern (or a phase pattern, a dimming pattern) is formed on the substrate having light transparency. However, instead of this mask, for example, as disclosed in U.S. Pat. No. 6,778,257, a variable molding mask (also referred to as an electronic mask, an active mask, or an image generator) may be used which forms a transparent pattern, a reflective pattern, or a light-emitting pattern based on electronic data of the pattern to be exposed. For example, the variable molding mask includes Digital Micro-mirror Device (DMD) which is a kind of a non-light emission type image display element (spatial light modulator), or the like. Moreover, the variable molding mask is not limited to DMD, and instead of DMD, a non-light emission type image display element described below may be used. Here, the non-light emission type image display element is an element which spatially modulates amplitude (intensity), phase, or a polarization state of the light advancing in a predetermined direction, and as a transmission type spatial light modulator, a transmission type liquid crystal display element (Liquid Crystal Display: LCD), an electrochromic display (ECD), or the like is exemplified. Moreover, as a reflection type spatial light modulator, in addition to the above-described DMD, a reflection mirror array, a reflection type liquid crystal display element, Electro Phonetic Display (EPD), electronic paper (or electronic ink), a diffraction-type light valve (Grating Light Valve), or the like is exemplified.

Furthermore, instead of the variable molding mask including the non-light emission type image display element, a pattern-forming apparatus including a spontaneous light emission type image display element may be provided at this case, an illumination system is not needed. Here, as the spontaneous light emission type image display element, for example, Cathode Ray Tube (CRT), Inorganic Electroluminescence Display, Organic Electroluminescence Display (Organic Light-Emitting Diode (OLED)), LED display, LD display, Field Emission Display (FED), Plasma Display (Plasma Display Panel (PDP)), or the like is exemplified. Moreover, as the spontaneous light emission type image display element included in the pattern-forming apparatus, by using a solid light source chip including a plurality of light-emitting points, a solid light source chip array in which chips are arranged in a plurality of arrays, a type in which a plurality of light-emitting points are formed in a single substrate, or the like, the solid light source chip is electrically controlled, and a pattern may be formed. Moreover, the solid light source element may be either an inorganic element or an organic element.

Moreover, for example, the present invention may be also applied to an exposure apparatus (a lithography system) in which interference fringes are formed on the substrate W, and thus, a line-and-space pattern is exposed on the substrate W, as disclosed in PCT International Publication No. WO 2001/035168.

As described above, the exposure apparatuses EX of the present embodiments are manufactured by assembling various subsystems including each component so as to maintain predetermined mechanical accuracy, electrical accuracy, and optical accuracy. In order to secure the various accuracies, before and after the assembly, adjustment for achieving optical accuracy with respect to various optical systems, adjustment for achieving mechanical accuracy with respect to various mechanical systems, and adjustment for achieving electrical accuracy with respect to various electrical systems are performed. The process of assembling the exposure apparatus from various subsystems includes mechanical connections, wiring connections of electric circuits, piping connections of air-pressure circuits, or the like between various subsystems. The respective assembly processes of each subsystem are needed before the assembly process from the various subsystems to the exposure apparatus. If the assembly process from various subsystems to the exposure apparatus ends, a general adjustment is performed, and thus, various accuracies in the overall exposure apparatus are secured. Moreover, it is preferable that the manufacturing of the exposure apparatus be performed in a clean room in which temperature, degree of cleanness, or the like is managed.

Next, a manufacturing method of a micro-device such as a semiconductor device using the above-described exposure apparatus EX will be described with reference to FIG. 13.

Figure 13:
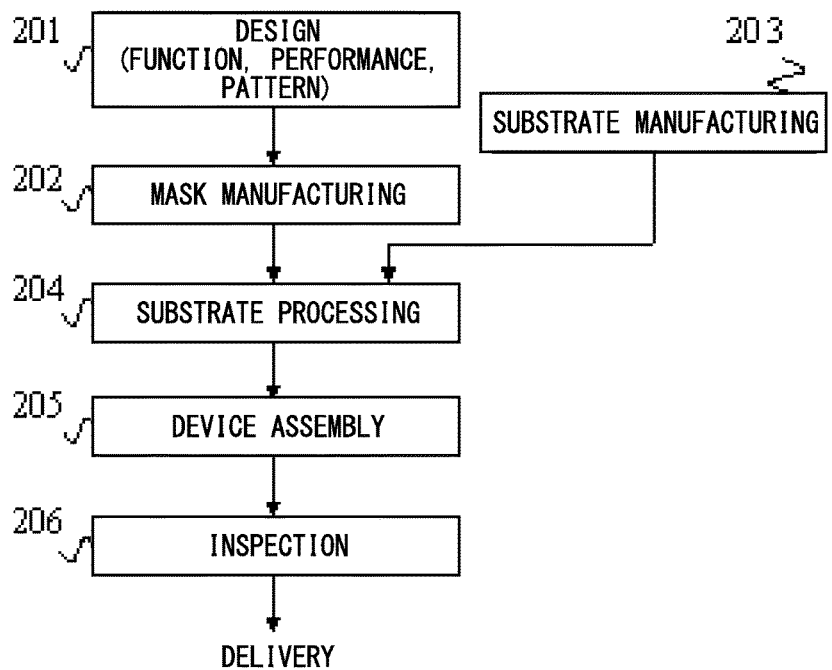
FIG. 13 is a flowchart showing an example of a manufacturing process of a micro-device.

FIG. 13 is a flowchart showing an example of a manufacturing process of a micro-device. As shown in FIG. 13, a micro-device such as a semiconductor device is manufactured through a step 201 in which the function and performance design of the micro-device is performed, a step 202 in which a mask (reticle) is manufactured based on the design step, a step 203 in which a substrate which is a base material of the device is manufactured, a substrate-processing step 204 which includes the substrate-processing (exposure processing) including exposing the substrate by the exposure light via the mask M according to the above-described embodiments and developing the exposed substrate, a device assembly step (which includes manufacturing processes such as a dicing process, a bonding process, and a package process) 205, an inspection step 206, or the like.

Moreover, the conditions of each embodiment and the modifications described above may be appropriately combined. Furthermore, the disclosures of all publications and United States Patents cited in each embodiment described above are cited, and become a portion of the disclosures of the present application.

BRIEF DESCRIPTION OF THE REFERENCE SYMBOLS

M: mask (object, plate-like object, optical member, plate-like optical member), 1: mask stage apparatus (holding apparatus, base material), MS: mask stage, 22: stage main body (base), 23: mask-holding portion (holding portion), 23*a*: first mask-holding portion (first holding portion), 23*b*: second mask-holding portion (second holding portion), 25*a*, 25*b*: movable element, 38*a*, 38*b*: holding portion (first member), 39*a*, 39*b*: lower block portion (second member), 40*a*: hinge portion (connection member, support portion), 44*a*: first suction pocket (action surface), 45*a*, 45*b*: first communication tube (gas flow port), 46*a*, 46*b*: first connection portion, 50*a*: second suction pocket (action surface), 51*a*, 51*b*: second communication tube (gas flow port), 53*a*: third suction pocket (action surface), 54*a*: third communication tube (gas flow port), 55*a*: fourth suction pocket (action surface), 68*a*: first mask-holding portion (first holding portion), 68*b*: second mask-holding portion (second holding portion), 78*a*, 78*b*, 88*a*, 88*b*, 98*a*, 98*b*: division-holding portion, 58*a*: guide portion (guide member)

The invention claimed is:

1. A holding apparatus configured to hold an object so that at least a portion of the object is set along a plane, the plane including a first axis and a second axis orthogonal to the first axis, the holding apparatus comprising:
   a base having a rigid structure,
   a holding portion provided on the base, and including:
      a first member that suctions and holds a portion of the object against a holding surface of the first member;
      a second member that is fixed to the base by a connecting portion; and
      a connection member that connects the first member to the second member, and having a flexible structure; and a driving unit that drives at least a part of the holding portion and that changes an inclination of the holding surface around the second axis relative to the base, while having the connection portion between the second member and the base serving as a fixed supporting point for the movement of the holding surface relative to the base, wherein
the at least the part of the holding portion is driven by the driving unit and thereby the connection member is deformed,
the object is deformed by the changing the inclination of the holding surface, and
when the inclination of the holding surface is changed, a position of the holding surface changes in a direction of the first axis due to the deformation of the connection member.

2. The holding apparatus according to claim 1, wherein the connection member changes the position of the holding surface with respect to the connecting portion in the first axis direction more largely as the change of the inclination of the holding surface around the second axis is larger.

3. The holding apparatus according to claim 1, wherein the connection member changes a relative distance between the holding surface and the connecting portion along the first axis direction depending on the change of the inclination of the holding surface around the second axis.

4. The holding apparatus according to claim 1, wherein the holding portion comprises a plurality of portions of the holding surface, wherein the plurality of portions of the holding surface respectively suction and hold different portions of the object.

5. The holding apparatus according to claim 1, wherein the object is a plate-like object,
the holding portion comprises a first holding portion that holds a first end portion of the plate-like object and a second holding portion that holds a second end portion of the plate-like object, and
the first and second holding portions further comprise the first member, the second member, and the connection member, respectively.

6. The holding apparatus according to claim 5, wherein the driving unit bends the plate-like object by changing an inclination of the holding surface of the first holding portion and an inclination of the holding surface of the second holding portion in different directions with each other.

7. The holding apparatus according to claim 1, further comprising a main body driving unit that drives the base in a direction of the second axis.

8. The holding apparatus according to claim 7, wherein a plurality of portions of the first member are disposed independently with each other along a direction parallel to the second axis.

9. The holding apparatus according to claim 1, wherein the driving unit comprises a first driving unit and a second driving unit that inclines the holding surface in a direction different from a direction in which the first driving unit inclines the holding surface.

10. The holding apparatus according to claim 9, wherein the first driving unit drives the first member.

11. The holding apparatus according to claim 9, wherein the second driving unit drives the second member and inclines the holding surface via the connection member.

12. The holding apparatus according to claim 9, wherein at least one of the first driving unit and the second driving unit comprises a gas flow port through which gas flows, and an action surface which is opposite to the gas flow port and on which a pressure of the gas is affected.

13. The holding apparatus according to claim 12, wherein the pressure of the gas is a negative pressure and a suction force is affected on the action surface.

14. An exposure apparatus comprising the holding apparatus according to claim 1,
wherein the holding apparatus is capable of holding a mask on which a pattern is formed as the object, and
wherein the pattern is transferred to a substrate.

15. An exposure method using the exposure apparatus according to claim 14, the exposure method comprising:
deforming the mask; and
transferring the pattern of the mask to the substrate.

16. A manufacturing method of a device, the manufacturing method comprising:
exposing the substrate using the exposure apparatus according to claim 14; and
developing the exposed substrate.

17. A holding apparatus that holds a surface of a mask on which a pattern is formed parallel to a plane, which includes a first axis and a second axis orthogonal to the first axis, the holding apparatus comprising:
a base having a rigid structure,
a holding portion provided on the base, and including:
a first member which suctions and holds a portion of the mask against a holding surface of the first member;
a second member which is fixed to the base by a connecting portion; and
a connection member which connects the first member to the second member, and having a flexible structure; and
a driving unit that drives at least a part of the holding portion and that changes an inclination of the holding surface around the second axis relative to the base, while having the connecting portion between the second member and the base serving as a fixed supporting point for the movement of the holding surface relative to the base,
wherein
the at least the part of the holding portion is driven by the driving unit and thereby the connection member is deformed,
the holding portion comprises a first holding portion that holds a first end portion of the mask and a second holding portion that holds a second end portion of the mask,
the first and second holding portions further comprises the first member, the second member, and the connection member, respectively,
the driving unit deforms the mask by the changing the inclination of the holding surface of the first holding portion and the inclination of the holding surface of the second holding portion in different directions with each other, and
when the inclination of the holding surface is changed, a position of the holding surface changes along a direction of the first axis due to the deformation of the connection member.

18. An exposure apparatus comprising the holding apparatus according to claim 17,
wherein the pattern of the mask is transferred to a substrate.

19. A manufacturing method of a device, the manufacturing method comprising:
exposing the substrate using the exposure apparatus according to claim 18; and
developing the exposed substrate.

* * * * *